(12) United States Patent
Li et al.

(10) Patent No.: US 9,246,052 B2
(45) Date of Patent: Jan. 26, 2016

(54) PACKAGING STRUCTURE OF LIGHT EMITTING DIODE AND METHOD OF MANUFACTURING THE SAME

(75) Inventors: Jinmin Li, Beijing (CN); Hua Yang, Beijing (CN); Xiaoyan Yi, Beijing (CN); Junxi Wang, Beijing (CN)

(73) Assignee: Institute of Semiconductors, Chinese Academy of Sciences, Beijing (CN)

( * ) Notice: Subject to any disclaimer, the term of this patent is extended or adjusted under 35 U.S.C. 154(b) by 0 days.

(21) Appl. No.: 14/232,443

(22) PCT Filed: Mar. 14, 2012

(86) PCT No.: PCT/CN2012/072310
§ 371 (c)(1),
(2), (4) Date: Apr. 22, 2014

(87) PCT Pub. No.: WO2013/010389
PCT Pub. Date: Jan. 24, 2013

(65) Prior Publication Data
US 2014/0264266 A1  Sep. 18, 2014

(30) Foreign Application Priority Data

Jul. 15, 2011  (CN) .......................... 2011 1 0198226
Jul. 15, 2011  (CN) .......................... 2011 1 0198263

(51) Int. Cl.
*H01L 21/00* (2006.01)
*H01L 27/15* (2006.01)
(Continued)

(52) U.S. Cl.
CPC ............... *H01L 33/06* (2013.01); *H01L 24/24* (2013.01); *H01L 33/007* (2013.01); *H01L 33/0095* (2013.01); *H01L 33/382* (2013.01); *H01L 33/486* (2013.01); *H01L 33/56* (2013.01); *H01L 33/58* (2013.01); *H01L 33/62* (2013.01); *H01L 33/385* (2013.01); *H01L 2924/12041* (2013.01)

(58) Field of Classification Search
CPC ......... H01L 33/32; H01L 33/20; H01L 33/62; H01L 33/486; H01L 33/504; H01L 33/60; H01L 25/167; H01L 25/0753
USPC ................ 257/79, 81, 84, 89, 98; 438/22, 24, 438/26–29
See application file for complete search history.

(56) References Cited

U.S. PATENT DOCUMENTS

2014/0159096 A1* 6/2014 Hsia et al. ........................ 257/98

FOREIGN PATENT DOCUMENTS

| CN | 1905224 | 1/2007 |
|----|---------|--------|
| CN | 1922733 | 2/2007 |
| CN | 101032034 | 9/2007 |
| CN | 101060116 | 10/2007 |

(Continued)

Primary Examiner — Hsien Ming Lee
(74) Attorney, Agent, or Firm — McDermott Will & Emery LLP

(57) ABSTRACT

The present disclosure relates to a light emitting diode packaging structure and the method of manufacturing the same. The light emitting diode packaging structure has an insulating substrate with through holes formed on each side of the upper surface thereof, the through hole being filled with conductive metal. Additionally, a n-type layer, an active layer, a p-type layer, an insulating layer and a p-type electrode are formed on the insulating substrate. The structure further may include a n-type electrode provided on a side of the upper surface of the n-type layer; a first back electrode provided at one side of the back surface of the insulating substrate; a second back electrode provided at the other side of back surface of the insulating substrate; and an optical element packaged on the base substrate.

17 Claims, 1 Drawing Sheet

(51) Int. Cl.
*H01L 29/22* (2006.01)
*H01L 33/06* (2010.01)
*H01L 33/48* (2010.01)
*H01L 33/62* (2010.01)
*H01L 23/00* (2006.01)
*H01L 33/00* (2010.01)
*H01L 33/56* (2010.01)
*H01L 33/58* (2010.01)
*H01L 33/38* (2010.01)

(56) References Cited

FOREIGN PATENT DOCUMENTS

| | | |
|---|---|---|
| CN | 201074776 | 6/2008 |
| CN | 101222012 | 7/2008 |
| CN | 201081157 | 7/2008 |
| CN | 101409266 | 4/2009 |
| CN | 102231421 | 11/2011 |
| CN | 102255034 | 11/2011 |
| EP | 2270889 | 1/2011 |

* cited by examiner

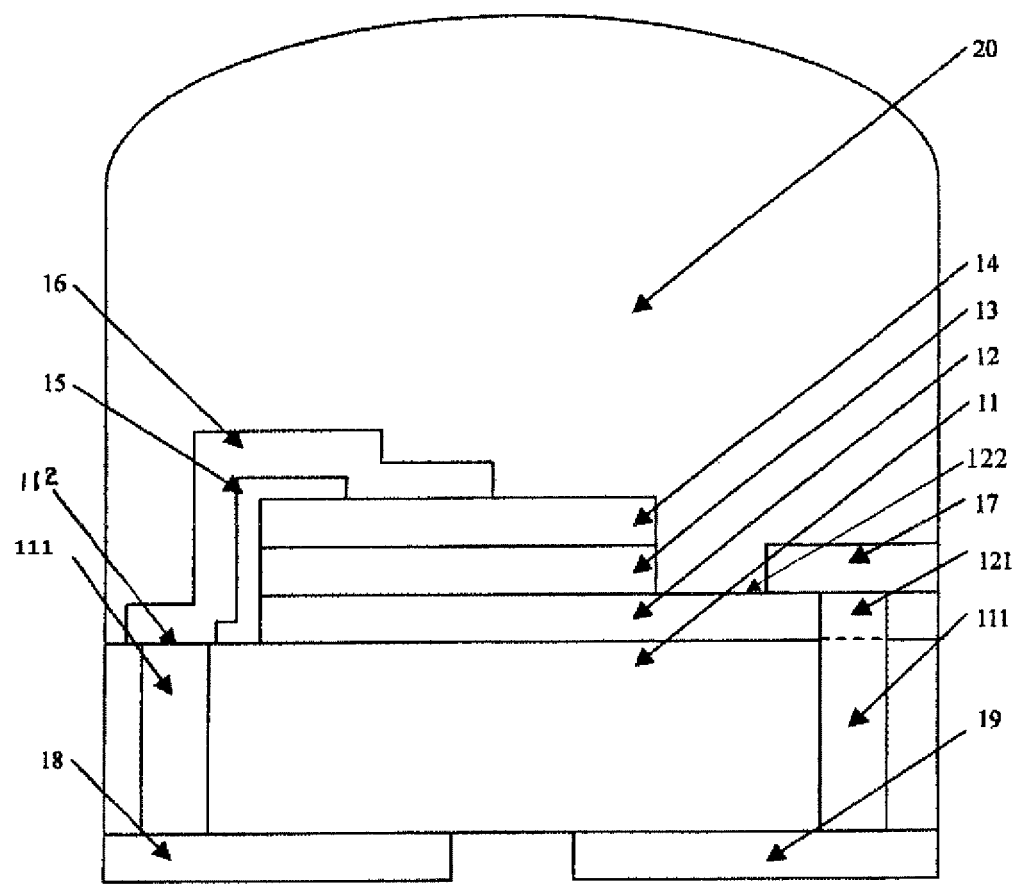

PACKAGING STRUCTURE OF LIGHT EMITTING DIODE AND METHOD OF MANUFACTURING THE SAME

TECHNICAL FIELD

The present invention relates to field of semiconductor technology, and more particularly, to a light emitting diode packaging structure manufactured by means of wafer level in-situ package technology and a method of manufacturing the same.

BACKGROUND

The conventional process for manufacturing a light emitting diode (LED) generally consists of three main steps including material epitaxy, chip technology and chip package. The basic function of semiconductor device package is to connect a chip electrode of a microsize chip to a relative big electrode structure so as to obtain facility for usage.

The packaging process for manufacturing a light emitting diode generally involves using a type of substrate or package or lead frame, bonding the light emitting diode chip on the substrate or package or lead frame in one way, and then connecting an electrode on the upper portion of the chip to a corresponding electrode of the substrate or package or lead frame by a ball bonding, so as to achieve electrical connection. Finally, a transparent package material is applied to the substrate or package or lead frame to finish an encapsulation or coverage in certain way, in which the transparent material is sometime formed to a certain shape in the macroscopic level to improve light extraction efficiency. Alternatively, a corresponding fluorescent material may be used for packaging or covering the chip, to achieve a certain application. As for this aspect, various package types and special functions thereof are respectively described in patents NO. US2010267174A1, US2005151142A1, CN201081157Y, CN201074776Y, US2008089064A1, CN201074776Y, CN101222012A, CN101409266A, CN10137137B, CN101060116B and EP2270889A2. As the development of the semiconductor technology, the proportion of material epitaxy and chip technology in cost to all the manufacture process of the light emitting diode decreases while the expense of package step is hard to be minished due to material expense, relative more steps and lower technological level. Therefore, it tends to develop integration and miniaturization of light emitting diode device. Currently, some wafer level packaging methods of light emitting diode device are disclosed to use a type of wafer (e.g., silicon wafer, ceramic plate, etc.) for substrate supporting the light emitting diode, such as, a packaging pattern of light emitting diode on an AlN substrate, originated from VisEra Technoloty. A type of chip scale packaging of light emitting diode (e.g., ZL200610108560.4 filed by Advanced Semiconductor Engineering Incorporated, and US20100163907A1 filed by China's Taiwan crystal aureole electric Co. LTD) is also disclosed. However, the disclosed methods of packaging still troublesomely involve times of transfer of a wafer or a plurality of wafers and thus relative material expense and many process steps. The current most of light emitting diodes are packaged by the methods mentioned above.

SUMMARY

To solve the problems in the art, a method of manufacturing a light emitting diode packaging structure are provided in the present disclosure.

It is objective of the present application to provide a method of manufacturing a light emitting diode packaging structure, integrating the chip technology and chip packaging process of light emitting diode and using the own substrate of the chip as a packaging substrate, from which simplified process path, decreased entire process cost, a smallest packaging volume, decreased package thermal resistance for the light emitting diode packaging structure can be achieved, thereby enabling improvement in controlling the electrical and optical properties of the light emitting diode. The method of manufacturing a light emitting diode packaging structure further has advantages of simpler structure and lower cost.

According to the present application, it is provided to a method of manufacturing a light emitting diode packaging structure, comprising:

1) growing a n-type layer, an active layer and a p-type layer in turn on an insulating substrate by means of metal organic vapour phase epitaxy, forming an epitaxy layer;

2) performing a down etching at one side on the surface of the p-type layer by means of lithographic process with an etching depth so as to reach the surface of the n-type layer to form a first mesa, and performing a down etching at other side on the surface of the p-type layer with an etching depth so as to reach the surface of the insulating substrate to form a second mesa;

3) forming a conductive through hole in the first mesa and the second mesa, which are filled with a conductive metal;

4) providing an insulating layer at the side of the epitaxy layer close to the second mesa, which covers part of the upper surface of p-type layer;

5) providing a p-type electrode on the insulating layer and covering it, the p-type electrode covering part of p-type layer and connecting with the conductive metal in the conductive through hole;

6) fabricating a n-type electrode on the conductive through hole in the first mesa, the n-type electrode connecting with the conductive metal in the conductive through hole;

7) thinning the insulating substrate;

8) fabricating a first back electrode and a second back electrode on each side of the back face of the thinned insulating substrate, respectively, wherein, the first back electrode and the second back electrode are connected with the p-type electrode and n-type electrode through the conductive metal in the conductive through holes, respectively, thereby obtaining a base substrate of a device;

9) packaging an optical element on the base substrate of the device, finishing the device on the base substrate;

10) cutting the device on the base substrate into a separating device by mechanical method;

wherein, the n-type layer and the p-type layer in the epitaxy structure are placed in positive or reverse order;

wherein, the material of insulating substrate is selected from the group consisting of: sapphire or silicon carbide or aluminum nitride;

wherein, the material of the n-type layer is n-type gallium nitride (GaN);

wherein, the active layer includes a quantum well structure made of gallium nitride material;

wherein, the material of p-type layer is p-type gallium nitride;

wherein, the material of insulating layer is silicon oxide or silicon nitride;

wherein, the p-type electrode, the n-type electrode, the first back electrode and the second back electrode are made of conductive metal;

wherein, the optical element is made of resin, or silica gel, or glass, or the combination thereof.

BRIEF DESCRIPTION OF THE DRAWINGS

The above and other objects, features and advantages of the present disclosure will be clearer from the following detailed description about the non-limited embodiments of the present disclosure taken in conjunction with the accompanied drawings, in which:

FIG. 1 is a schematic cross section of in situ a light emitting diode packaging structure according to the present application.

DETAILED DESCRIPTION OF EMBODIMENTS

Refers to FIG. 1, a method of manufacturing a light emitting diode packaging structure is described, comprising one or more of the steps of:

growing a n-type layer 12, an active layer 13 and a p-type layer 14 in turn on an insulating substrate 11 by means of metal organic vapor phase epitaxy, forming an epitaxy layer, wherein the material of the insulating substrate 11 is sapphire, silicon carbide or aluminum nitride, and the n-type layer 12 and the p-type layer 14 in the epitaxy structure are placed in positive or reverse order, in which the materials of the n-type layer 12 and the p-type layer 14 are respectively n-type gallium nitride and p-type gallium nitride and the active layer 13 includes a quantum well structure made of gallium nitride material;

performing a down etching at one side on the surface of the p-type layer 14 by means of lithographic process with an etching depth so as to reach the surface of the n-type layer 12 to form a first mesa 112, and performing a down etching at other side on the surface of the p-type layer 14 with an etching depth so as to reach the surface of the insulating substrate 12 to form a second mesa 122, in which the etching method applied to the p-type layer 14 is a dry etching or wet etching;

forming a conductive through hole 111 in the second mesa 112 and the first mesa 121, which are provided with a conductive metal, wherein the conductive through holes 111 may be round hole or groove, and may be fabricated by means of laser beam drilling, or dry etching, or optical assistant wet etching process, and are not limited in number, and wherein the conductive through holes 111 are filled with metal by means of plasma sputtering, or electron beam evaporation, or chemical plating, or electrochemistry plating process;

providing an insulating layer 15 at the side of the epitaxy layer close to the second mesa 112 and covering part of the upper surface of p-type layer 14, wherein the material of the insulating layer 15 is silicon oxide or silicon nitride, which is fabricated by electron beam evaporation, or PECVD or iron sputtering process;

providing a p-type electrode 16 on the insulating layer 15 and covering it, the p-type electrode 16 covering part of p-type layer 14 and connecting with the conductive metal in the conductive through hole 111, wherein the p-type electrode 16 forms an ohmic contact with the p-type layer 14 and thus obtain good current expansion on the p-type layer 14;

fabricating a n-type electrode 17 on the conductive through hole 111 in the first mesa 121, the n-type electrode 17 connecting with the conductive metal in the conductive through hole 111, wherein the n-type electrode 17 forms an ohmic contact with the n-type layer 12 and thus obtain good current expansion on the n-type layer 12, and wherein the p-type electrode 16 and the n-type electrode 17 include conductive metal.

An optical element 20 is packaged on the base substrate of the device, in which the optical element 20 is made individually or in combination of resin, or silicon gel, or glass, or other transparent materials. The optical element 20 may function to support the device and protect the device from incursion of vapor, dirt and harmful gas. Further, the optical element 20 may improve luminescence efficiency of the device, in which the optical element 20 functions to achieve fluorescence conversion. The optical element 20 may also function to adjust the external light field distribution.

The insulating substrate 11 may be further processed to be thinned and thus thinner than that in conventional process due to the existence of the optical element 20, enabling to obtain a reduced thermal resistance.

A first back electrode 18 and a second back electrode 19 may be further fabricated on each side of the back face of the thinned insulating substrate 11, respectively, wherein the first back electrode 18 and the second back electrode 19 are connected with the p-type electrode 16 and n-type electrode 17 through the conductive metal in the conductive through holes 111, respectively, and are made of conductive metal, in which the first back electrode 18 and the second back electrode 19 are made of weldable metal or alloy such that the present resulting packaging structure may be welded to other circuit structure.

The objective, technical scheme and advantageous technical effect of the present application have been described in detail by the above embodiments and FIGURES. It is understood that the above description is just directed to embodiments of the present application and modifications, equivalent replacement and improvements may be made by those skilled in the art to the invention without departing from the scope of the present application.

What is claimed is:

1. A light emitting diode packaging structure, comprising:
an insulating substrate with through holes formed on each side of the upper surface of the insulating substrate, the through hole being filling with conductive metal;
a n-type layer formed on the insulating substrate and configured to cover most of area of an upper surface of the insulating substrate such that a mesa is formed at one side of the insulating substrate while a hole is provided on the other side in the n-type layer with relative to the mesa, which is fit for the through hole in the insulating substrate and filled with conductive metal;
an active layer provided on and at one side of the n-type layer, the area of the active layer being smaller than that of the n-type layer;
a p-type layer provided on the active layer;
an insulating layer configured on one side of the n-type layer, the active layer and the p-type layer and to cover part of the upper surface of the p-type layer;
a p-type electrode configured to cover the insulating layer and part of the upper surface of the p-type layer, the p-type electrode being connected with the conductive metal in the through hole in the insulating substrate;
a n-type electrode provided on a side of the upper surface of the n-type layer and configured to connect with the conductive metal in the through hole in the insulating substrate;
a first back electrode provided at one side of back surface of the insulating substrate, the first back electrode connecting with the p-type electrode through the conductive metal in the through hole in the insulating substrate;
a second back electrode provided at the other side of back surface of the insulating substrate, the second back electrode connecting with the n-type electrode through the conductive metal in the through hole in the insulating substrate, thereby forming a base substrate of a device;
an optical element packaged on the base substrate.

2. A light emitting diode packaging structure as claim 1, wherein the material of the insulating substrate is selected from the group consisting of: sapphire, silicon carbide and aluminum nitride.

3. A light emitting diode packaging structure as claim 1, wherein the material of the n-type layer is n-type gallium nitride (GaN).

4. A light emitting diode packaging structure as claim 1, wherein the active layer includes a quantum well structure made of gallium nitride material.

5. A light emitting diode packaging structure as claim 1, wherein the material of p-type layer is p-type gallium nitride.

6. A light emitting diode packaging structure as claim 1, wherein the material of insulating layer is silicon oxide or silicon nitride.

7. A light emitting diode packaging structure as claim 1, wherein the p-type electrode, the n-type electrode, the first back electrode and the second back electrode are made of conductive metal.

8. A light emitting diode packaging structure as claim 1, wherein the optical element is made of resin, or silica gel, or glass, or the combination thereof.

9. A method of manufacturing a light emitting diode packaging structure, comprising:
  1) growing a n-type layer, an active layer and a p-type layer in turn on an insulating substrate by means of metal organic vapour phase epitaxy, to form an epitaxy structure;
  2) performing a down etching at one side on the surface of the p-type layer by means of lithographic process with an etching depth so as to reach the surface of the insulating substrate to form a first mesa, and performing a down etching at other side on the surface of the p-type layer with relative to the first mesa with an etching depth so as to reach the surface of the n-type layer to form a second mesa;
  3) forming conductive through holes in the first mesa and the second mesa, which are filled with a conductive metal;
  4) providing an insulating layer at the side of the epitaxy layer close to the first mesa, which covers part of the upper surface of p-type layer;
  5) providing a p-type electrode on the insulating layer, which covers the insulating layer, the p-type electrode covering part of p-type layer and connecting with the conductive metal in the conductive through hole;
  6) fabricating a n-type electrode on the conductive through hole in the second mesa, the n-type electrode connecting with the conductive metal in the conductive through hole;
  7) thinning the insulating substrate;
  8) fabricating a first back electrode and a second back electrode on each side of the back face of the thinned insulating substrate, respectively, wherein, the first back electrode and the second back electrode are connected with the p-type electrode and n-type electrode through the conductive metal in the conductive through holes, respectively, thereby obtaining a base substrate of a device;
  9) packaging an optical element on the base substrate of the device, finishing the process of manufacturing the device on the base substrate;
  10) cutting the device on the base substrate into a separating device by mechanical method.

10. A method of manufacturing a light emitting diode packaging structure as claim 9, wherein the n-type layer and the p-type layer in the epitaxy structure are placed in positive or reverse order.

11. A method of manufacturing a light emitting diode packaging structure as claim 9, wherein the material of insulating substrate is selected from the group consisting of: sapphire, silicon carbide and aluminum nitride.

12. A method of manufacturing a light emitting diode packaging structure as claim 9, wherein the material of the n-type layer is n-type gallium nitride (GaN).

13. A method of manufacturing a light emitting diode packaging structure as claim 9, wherein the active layer includes a quantum well structure made of gallium nitride material.

14. A method of manufacturing a light emitting diode packaging structure as claim 9, wherein the material of p-type layer is p-type gallium nitride.

15. A method of manufacturing a light emitting diode packaging structure as claim 9, wherein the material of insulating layer is silicon oxide or silicon nitride.

16. A method of manufacturing a light emitting diode packaging structure as claim 9, wherein the p-type electrode, the n-type electrode, the first back electrode and the second back electrode are made of conductive metal.

17. A method of manufacturing a light emitting diode packaging structure as claim 9, wherein the optical element is made of resin, or silica gel, or glass, or the combination thereof.

* * * * *